US011574757B2

(12) United States Patent
Li et al.

(10) Patent No.: US 11,574,757 B2
(45) Date of Patent: Feb. 7, 2023

(54) MULTI-FUNCTIONAL SPINTRONIC LOGIC GATE DEVICE

(71) Applicant: SHENZHEN SPIN TECHNOLOGY, Guangdong (CN)

(72) Inventors: Xiaoguang Li, Shenzhen (CN); Yan Zhou, Shenzhen (CN)

(73) Assignee: THE CHINESE UNIVERSITY OF HONG KONG, SHENZHEN, Shenzhen (CN)

( * ) Notice: Subject to any disclaimer, the term of this patent is extended or adjusted under 35 U.S.C. 154(b) by 0 days.

(21) Appl. No.: 17/605,994

(22) PCT Filed: May 16, 2019

(86) PCT No.: PCT/CN2019/087133
§ 371 (c)(1),
(2) Date: Oct. 22, 2021

(87) PCT Pub. No.: WO2020/215403
PCT Pub. Date: Oct. 29, 2020

(65) Prior Publication Data
US 2022/0199311 A1     Jun. 23, 2022

(30) Foreign Application Priority Data

Apr. 24, 2019   (CN) .......................... 201910335948.5

(51) Int. Cl.
*H01F 10/32*     (2006.01)
*H03K 19/21*    (2006.01)
(52) U.S. Cl.
CPC ......... *H01F 10/3254* (2013.01); *H03K 19/21* (2013.01)

(58) Field of Classification Search
CPC ..... H03K 19/18; H03K 19/21; H01F 10/3254
See application file for complete search history.

(56) References Cited

U.S. PATENT DOCUMENTS

| 10,957,370 | B1* | 3/2021 | Beery | H01L 21/20 |
| 2017/0077392 | A1* | 3/2017 | Han | H03K 19/18 |
| 2020/0217907 | A1* | 7/2020 | Raberg | H01L 43/10 |
| 2020/0341079 | A1* | 10/2020 | Swerts | G01R 33/098 |

FOREIGN PATENT DOCUMENTS

CN            105895799 A       8/2016

* cited by examiner

*Primary Examiner* — Jany Richardson
(74) *Attorney, Agent, or Firm* — Novoclaims Patent Services LLC; Mei Lin Wong (57) ABSTRACT

A multi-functional spintronic logic gate device. The device comprises: a magnetic tunnel junction. the magnetic tunnel junction sequentially comprising a reference layer. a tunneling insulation layer, and a free layer from a top layer to a bottom layer, and a separation layer being arranged on at least one side of the two sides of the free layer; a bottom electrode, adjacent to and in contact with the bottom layer of the magnetic tunnel junction and made of a heavy metal material, the periphery of the bottom electrode being coupled to first and second terminals. the first and second terminals being opposite to each other with respect to the bottom electrode, and the bottom electrode being used for receiving a logic input current in a direction pointing to the second terminal along the first terminal; and a top electrode positioned above the reference layer.

20 Claims, 3 Drawing Sheets

MULTI-FUNCTIONAL SPINTRONIC LOGIC GATE DEVICE

CROSS REFERENCE OF RELATED APPLICATION

This is a national phase national application of an international patent application number PCT/CN2019/087133 with a filing date of May 16, 2019, which claimed priority of Chinese application number 201910335948.5, filing date Apr. 24, 2019. The contents of these specifications, including any intervening amendments thereto, are incorporated herein by reference.

BACKGROUND OF THE PRESENT INVENTION

Field of Invention

The present invention relates to the field of spintronic devices, and specifically relates to a nonvolatile multi-functional logic gate device of spin-orbit torque-based precessional magnetization switching. It should be noted that the present invention also relates to a magnetic random access memory device since the multi-functional spintronic logic gate device of the present invention has both operation and power-loss storage functions.

Description of Related Arts

In the Von Neumann computer architecture, data processing and data storage are discrete, with operations requiring data to be extracted from the memory and then re-saved after the processor has completed its computation. In recent years, processor performance has improved dramatically, while it is still difficult to break the access rate bottleneck of the memory. Studies have shown that the energy required to exchange data between the CPU and off-chip memory has exceeded the energy required for the floating-point operation by about two orders of magnitude, making it a key technical bottleneck in computer performance improvement.

In order to meet the challenge above, the use of non-volatile data memory devices for logical operations has been proposed in recent years. On one hand, these devices can retain logical values when power is lost, with no standby energy consumption; on the other hand, the energy consumption for data exchange is significantly reduced due to the two functions of data processing and computation. Spin-orbit torque-based magnetic random memory devices are considered to be the main alternative for a new generation of "In-memory Computing" devices because of their non-volatility and significant advantages in terms of power consumption, operation delay and endurance.

The magnetic tunnel junction is the core component of these magnetic "In-memory Computing" devices in the prior art, and it generally comprises a free layer, a reference layer and a tunneling insulation layer located between the two. The magnetization of the free layer is free to flip, while the magnetization of the reference layer is fixed or has a high coercive force so that it will not be affected by external excitation factors, such as magnetic field, current and temperature. The tunneling insulation layer is made of an insulating material such as metal oxide. The resistance of the magnetic tunnel junction varies proportionally to the cosine $\cos(\theta)$ of the included angle $\theta$ between the magnetization of the free layer and that of the reference layer. When the magnetization of the free layer and that of the reference layer are parallel to each other, the magnetic tunnel junction has the lowest resistance and is in the low resistance state; when the magnetization of the free layer and that of the reference layer are anti-parallel, the magnetic tunnel junction has the highest resistance and is in the high resistance state. The resistance states above can correspond to Binary digit 0 and 1 respectively, or can correspond to Binary digit 1 and 0 respectively. The storage or logical operation of binary digit can be realized by manipulating the magnetization of the free layer by means of, for example, polarization current or electric field.

Currently, spin-orbit torque-based magnetic logic gate devices require a magnetic field applied in the direction of the current to achieve a stable magnetization switching, thus realizing the basic resistance switching function. However, from the perspective of CMOS (Complementary Metal Oxide Semiconductor) integration, the use of an external magnetic field source has a negative impact on the integration density and stability of the device, which is not practically feasible. Besides, even in the presence of an applied magnetic field, the existing solution still requires multiple current controls or further auxiliary means such as electric field regulation to realize the logical operation function, which greatly increases the complexity and cost of the circuit. In addition, the existing solution realizes the logic AND and OR function with the above-mentioned complex method, but the XOR function can only be realized by cascading multiple devices, which will multiply the power consumption of devices and increase the logical operation delay.

SUMMARY OF THE PRESENT INVENTION

An object of the present invention is to provide a multi-functional spintronic logic gate device in order to solve at least one of the defects of the prior art in the analysis above.

The present invention eliminates the need for auxiliary means such as an applied magnetic or electric field and realizes the multi-threshold resistance switching of the magnetic tunnel junction only by controlling the intensity and width of the input current pulse. Based on this characteristic, the present invention further provides a logic gate device which can realize the bitwise operation functions of AND gate, NAND gate, OR gate, NOR gate, XOR gate and XNOR gate through current pulse control.

Specifically, disclosed is a multi-functional spintronic logic gate device which comprises: a magnetic tunnel junction, the magnetic tunnel junction sequentially comprising a reference layer, a tunneling insulation layer, and a free layer from a top layer to a bottom layer, a separation layer being arranged on at least one side of the two sides of the free layer, and the separation layer being made of any combination of one or more of platinum, tantalum, tungsten, titanium, rubidium, chromium, hafnium, aluminum, and corresponding metal oxides; a bottom electrode, adjacent to and in contact with the bottom layer of the magnetic tunnel junction and made of a heavy metal material, the periphery of the bottom electrode being coupled to first and second terminals, the first and second terminals being opposite to each other with respect to the bottom electrode and the bottom electrode being used for receiving a logic input current in a direction pointing to the second terminal along the first terminal; and a top electrode positioned above the reference layer.

In some embodiments, each of the two sides of the free layer has a separation layer.

In some embodiments, the free layer is a single-layer film composed of cobalt, iron, nickel, palladium, aluminum, and the alloy or boron-doped alloy of the elements above, or a composite film of multi-layer film.

In some embodiments, the thickness range of the separation layer is 0~2 nm, the thickness range of the bottom electrode is 0~10 nm, and the thickness range of the free layer is 0.5~10 nm.

In some embodiments, the signal of the logic input current is the current with constant current pulse intensity and varying current pulse width, or the current with constant current pulse width and varying current pulse intensity.

In some embodiments, when the current pulse width of the logic input current is constant and the current pulse intensity is varying, as the current pulse intensity increases, there shall be at least a first threshold current density that causes a 180° flip in the initial magnetization direction of the free layer, recorded as $I_{c1}$, a second threshold current density that causes a 360° flip in the initial magnetization direction of the free layer, recorded as $I_{c2}$, a third threshold current density that causes a 540° flip in the initial magnetization direction of the free layer, recorded as $I_{c3}$; when the current pulse intensity of the logic input current is constant and the current pulse width is varying, as the current pulse width increases, there shall be at least a first pulse width threshold that causes a 180° flip in the initial magnetization direction of the free layer, recorded as $T_{c1}$, a second pulse width threshold that causes a 360° flip in the initial magnetization direction of the free layer, recorded as $T_{c2}$, a third pulse width threshold that causes a 540° flip in the initial magnetization direction of the free layer, recorded as $T_{c3}$.

In some embodiments, the logic input current is the composition of the first input current and the second input current, the current intensity of the logic input current is equal to the sum of the current intensity of the first input current and that of the second input current, or the pulse width of the logic input current is equal to the sum of the pulse width of the first input current and that of the second input current; the current intensity of the first input current and the second input current has two states of high and low levels, with the high and low states recorded as $I_H$ and $I_L$, corresponding to 1 and 0 or 0 and 1, respectively; or the first input current and the second input current have two states of long and short pulse widths, with the two states of long and short pulses recorded as $t_H$ and $t_L$, corresponding to 1 and 0 or 0 and 1, respectively.

In some embodiments, setting $I_H+I_L<I_{c1}$, and $I_{c1}</I_H<I_{c2}/2$; or setting $I_L+t_H<t_{c1}$, and $t_{c1}/2<t_H<t_{c2}/2$; when the free layer and the reference layer are initially magnetized in the anti-parallel direction, the multi-functional spintronic logic gate device is configured as a logic AND gate, and when the free layer and the reference layer are initially magnetized in the parallel direction, the multi-functional spintronic logic gate device is configured as a logic NAND gate.

In some embodiments, setting $I_L<I_{c1}/2$, $I_{c2}/2<I_H<I_{c3}/2$ and $I_{c1}<I_L+I_H<I_{c2}$; or setting $I_L<t_{c1}/2$, $t_{c2}/2<t_H<t_{c3}/2$ and $t_{c1}<t_L+t_H<t_{c2}$; when the free layer and the reference layer are initially magnetized in the anti-parallel direction, the multi-functional spintronic logic gate device is configured as a logic XOR gate, and when the free layer and the reference layer are initially magnetized in the parallel direction, the multi-functional spintronic logic gate device is configured as a logic XNOR gate.

In some embodiments, setting $I_L<I_{c1}/2$, $I_{c3}/2<I_H<I_{c4}/2$ and $I_{c1}<I_L+I_H<I_{c2}$; or setting $I_L<t_{c1}/2$, $t_{c3}/2<t_H<t_{c4}/2$ and $t_{c1}<t_L+t_H<t_{c2}$; when the free layer and the reference layer are initially magnetized in the anti-parallel direction, the multi-functional spintronic logic gate device is configured as a logic OR gate, and when the free layer and the reference layer are initially magnetized in the parallel direction, the multi-functional spintronic logic gate device is configured as a logic NOR gate.

Compared to the prior art, the present invention eliminates the need for auxiliary means such as an applied magnetic or electric field and realizes the multi-threshold resistance switching of the magnetic tunnel junction only by controlling the intensity and width of the input current pulse. Based on this characteristic, the present invention provides a logic gate device which can realize the bitwise operation functions of AND gate, NAND gate, OR gate, NOR gate, XOR gate and XNOR gate through current pulse control. The present invention significantly decreases components required for basic logic gates, thus reducing the power consumption and delay of the logical operation. Besides, the present invention provides nonvolatile logic gate so that logic values can be retained in case of power loss, so it also has the function of data storage.

In the figures, 10 indicates bottom electrode, 11 first terminal, 12 second terminal, 20 top electrode, 30 magnetic tunnel junction, 31 reference layer, 32 tunneling insulation layer, 33 first separation layer, 34 free layer, 35 second separation layer.

DETAILED DESCRIPTION OF THE PREFERRED EMBODIMENT

To make the above-mentioned purposes, features and merits of the present invention more clear and easier to understand, the present invention is further detailed in combination with the drawings and embodiments.

Figure 1:
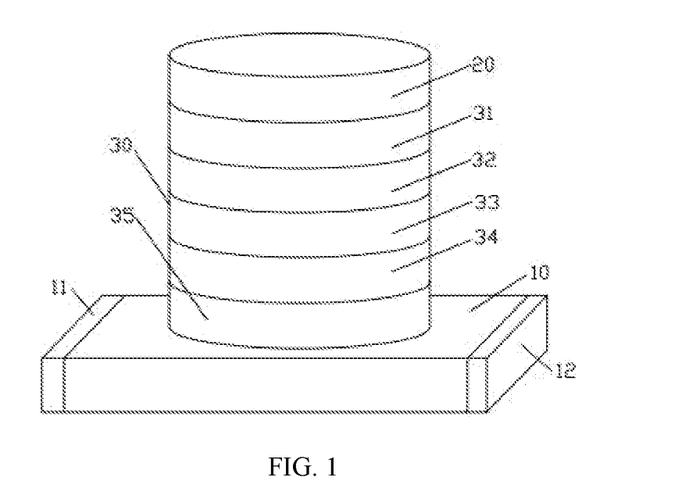
FIG. 1 is a schematic diagram of the structure of the multi-functional spintronic logic gate device.

FIG. 1 is a schematic diagram of the structure of the multi-functional spintronic logic gate device of the present invention: As shown in FIG. 1, the spintronic logic device comprises, from top to bottom, a top electrode 20, a magnetic tunnel junction 30 and a bottom electrode 10, wherein the magnetic tunnel junction comprises, from top to bottom, a reference layer 31, a tunneling insulation layer 32, a first separation layer 33, a free layer 34 and a second separation layer 35.

The material of the top electrode 20 includes, but not limited to, tantalum, aluminum and copper. The reference layer 31 is a single-layer or multi-layer film composed of cobalt, iron, nickel, and alloys of the elements above, as well as alloys of one or more of the elements above with platinum, palladium, aluminum and boron, or a multi-layer composite film formed by adding a tantalum, ruthenium and iridium separation layer between the above-mentioned films. The above-mentioned reference layer 31 has a magnetic anisotropy perpendicular to the plane of the film, as well as a high coercive force to ensure that its magnetized state is not affected by external excitation factors such as magnetic field, current or temperature.

The material of the tunneling insulation layer 32 includes, but not limited to, the oxides of magnesium, aluminum, titanium, tantalum and silicon, and boron-doped oxides containing the elements above. The tunneling insulation layer 32 is mainly used to produce a tunneling magnetoresistance effect, i.e. when the reference layer 31 and the free layer 34 are magnetized in the parallel direction, the magnetic tunnel junction 30 is in the low resistance state; when the reference layer 31 and the free layer 34 are magnetized in the anti-parallel direction, the magnetic tunnel junction 30 is in the high resistance state. A high resistance state can be represented as a logic value of 0, and a low resistance state as a logic value of 1, or a high resistance state can be represented as a logic value of 1 and a low resistance state as a logic value of 0. In this embodiment, the high resistance state of the magnetic tunnel junction 30 is represented as a logic value of 0 and the low resistance state as a logic value of 1. The two states of its resistance, or logic values, are read from the reading current $I_{read}$ flowing from the top electrode 20 to the second terminal 12.

The first separation layer 33 and the second separation layer 35 are single-layer films composed of platinum, tantalum, tungsten, titanium, rubidium, chromium, hafnium, aluminum or oxides of the metal elements above. The main function of the separation layer is to regulate the strength of the spin-orbit torque component by changing the interface on each side of the free layer 34, thus realizing the precessional magnetization switching under current pulse excitation.

The free layer 34 is a single-layer film composed of cobalt, iron, nickel, palladium, aluminum, and the alloy or boron-doped alloy of the elements above, or a composite film of multi-layer film. The free layer 34 has a magnetic anisotropy perpendicular to the plane of the film, as well as a low coercive force, and its magnetization direction can be changed by the current flowing through the bottom electrode 10 or by an applied magnetic field. The free layer 34 shall have a high damping coefficient, i.e. $\alpha > 0.05$.

The bottom electrode 10 is made of a heavy metal material, the periphery of the bottom electrode 10 being coupled to first and second terminals 11, 12, and the first and second terminals 11, 12 being opposite to each other with respect to the bottom electrode 10. The heavy metal material includes, but not limited to, one of tantalum, tungsten, platinum, gold, silver, rhenium, iridium, niobium, molybdenum, ruthenium, rhodium, palladium, titanium, vanadium, chromium, lead, bismuth, copper and hafnium, or an alloy containing any of the metal elements above.

The thickness range of the reference layer 31 is 1-30 nm, the thickness range of the tunneling insulation layer 32 is 0.5-2 nm, the thickness range of the first separation layer 33 is 0-2 nm, the thickness range of the free layer 34 is 0.5-10 nm, the thickness range of the second separation layer 33 is 0-2 nm, the thickness range of the bottom electrode 10 is 0.5 nm-15 nm, and the thickness of the top electrode 20 is not specifically limited. It should be noted that the geometry of the magnetic tunnel junction 30 is not limited to the cylindrical structure shown in FIG. 1, but it may also be elliptical, square, diamond-shaped and other columnar structures. Of course, the first separation layer 33 and the second separation layer 34 are not both zero, i.e. at least one separation layer is present.

Figure 2A:
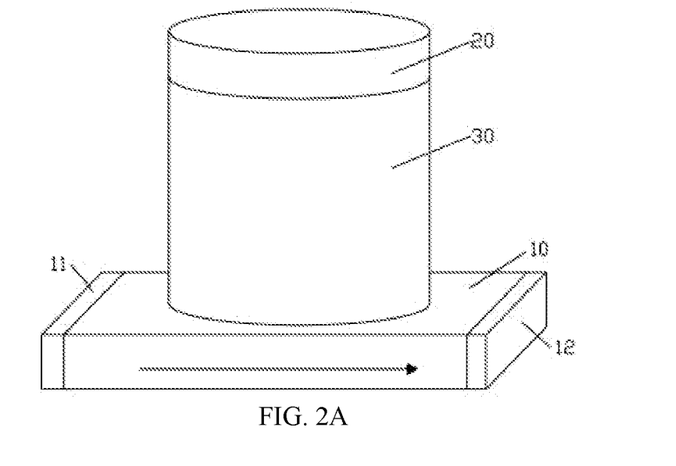
FIG. 2A is a schematic diagram of the structure of the multi-functional spintronic logic gate device when a logic input current is input to the bottom electrode, with the arrow indicating the logic input current.
Figure 3:
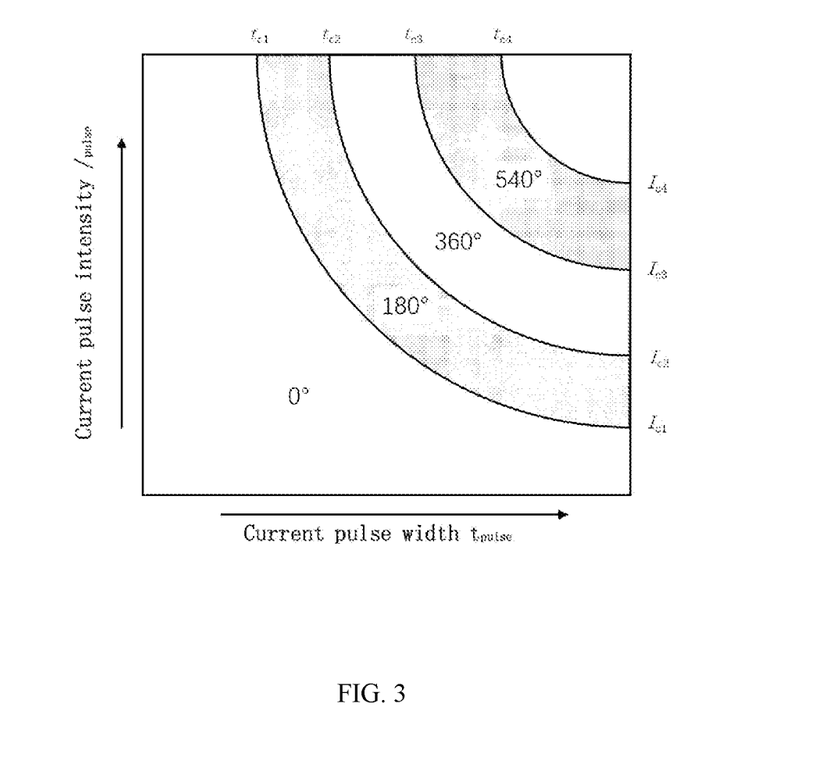
FIG. 3 is a schematic diagram of the principle of the precessional magnetization switching of the free layer.

The arrow in FIG. 2A indicates the logic input current. When the logic input current flows through the bottom electrode 10, electrons with a specific spin direction will go through the bottom electrode and accumulate at the interface between the second separation layer 35 and the free layer 34 due to spin-orbit coupling, forming a spin polarized current perpendicular to the plane of the film. Besides, the spin-orbit torque applied by the spin current on the magnetization of the free layer 34 has a strong field-like component under the influence of the spin Hall effect and the interfacial Rashba effect. The free layer 34 undergoes an precessional magnetization switching under the above effects, the characteristics of which are shown in FIG. 3: for a particular current pulse width, when the current strength is less than the first threshold current density $I_{c1}$, the magnetization direction of the free layer 34 does not change, and the resistance state of the magnetic tunnel junction 30 is the same as the initial state; when the current strength is greater than the first current threshold $I_{c1}$ and less than the second current threshold $I_{c2}$, the magnetization direction of the free layer 34 is rotated by 180° and the resistance state of the magnetic tunnel junction 30 is switched to another state; when the current density is greater than the second current threshold $I_{c2}$ and less than the third current threshold $I_{c3}$, the magnetization direction of the free layer 34 is rotated by 360° and the resistance state of the magnetic tunnel junction 30 is the same as the initial state; when the current density is greater than the third current threshold $I_{c3}$ and less than the fourth current threshold $I_{c4}$, the magnetization direction of the free layer 34 is rotated by 540° and the resistance state of the magnetic tunnel junction 30 is switched to another state. Besides, for a particular current pulse intensity, when the pulse width is less than the first width threshold $t_{c1}$, the magnetization direction of the free layer 34 does not change, and the resistance state of the magnetic tunnel junction 30 is the same as the initial state; when the current pulse width is greater than the first width threshold $t_{c1}$ to and less than the second width threshold $t_{c2}$, the magnetization direction of the free layer 34 is rotated by 180° and the resistance state of the magnetic tunnel junction 30 is switched to another state; when the current pulse width is greater than the second width threshold $t_{c2}$ and less than the third width threshold $t_{c3}$, the magnetization direction of the free layer 34 is rotated by 360° and the resistance state of the magnetic tunnel junction 30 is the same as the initial state; when the current pulse width is greater than the third width threshold $t_{c3}$ and less than the fourth width threshold $t_{c4}$, the magnetization direction of the free layer 34 is rotated by 540° and the resistance state of the magnetic tunnel junction 30 is switched to another state.

Figure 4A:
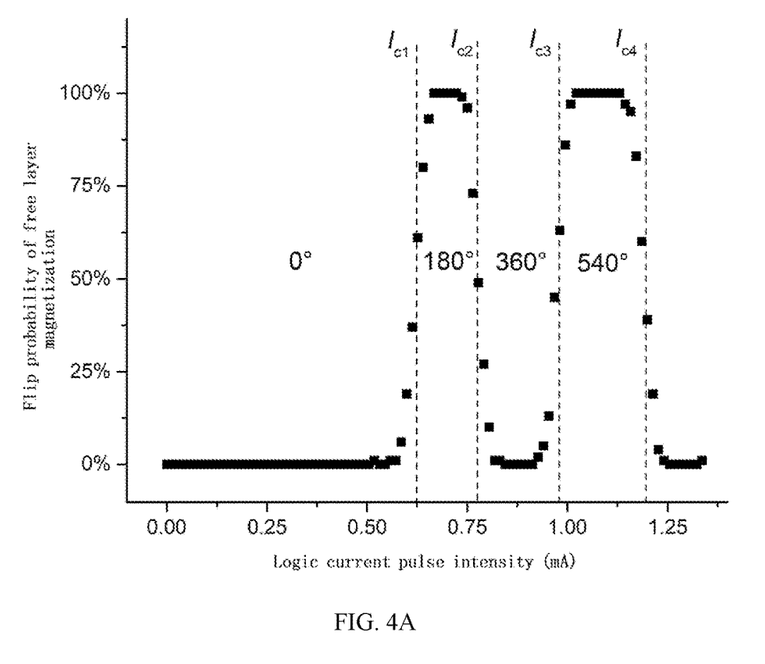
FIG. 4A is the magnetization switching characteristic of the free layer under the influence of strong field-like spin-orbit torque.
Figure 4B:
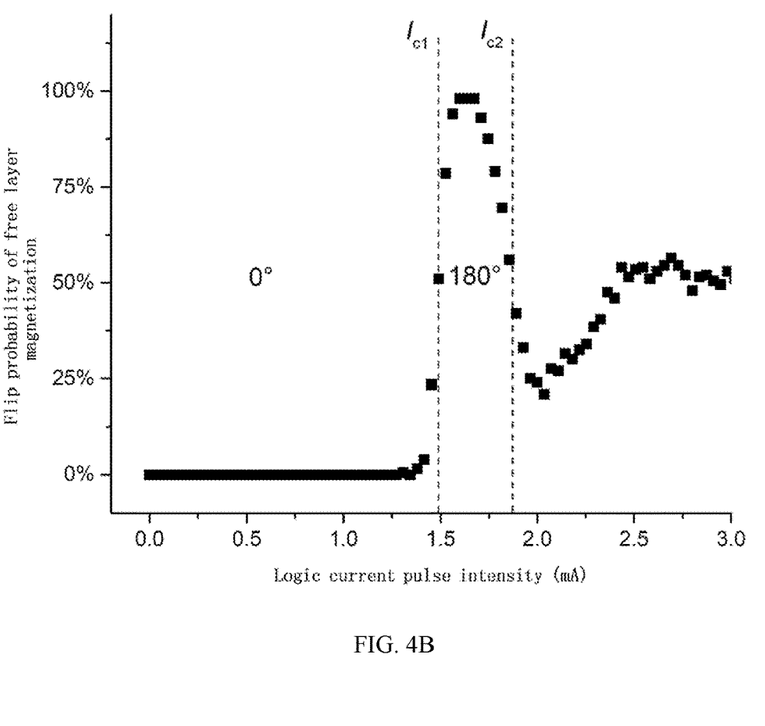
FIG. 4B is the magnetization switching characteristic of the free layer under the influence of weak field-like spin-orbit torque.

In the technical solution above, the main function of the first separation layer 33 and the second separation layer 35 is to regulate the spin-orbit torque damping-like spin-orbit torque $\zeta DL$ and the field-like spin-orbit torque $\zeta FL$ by changing the interface on each side of the free layer 34. In a specific embodiment, the tunneling insulation layer 32 is magnesium oxide with a thickness of 0.8 nm, the free layer 34 is a single-layer CoFeB film with a thickness of 0.8 nm, the thickness of the second separation layer 35 is 0nm, and the bottom electrode 10 is tantalum with a thickness of 5 nm. For the structure above, when the first separation layer 33 is hafnium oxide with a thickness of 0.2 nm, the spin-orbit torque damping-like spin-orbit torque $\zeta DL = -0.07$ and the spin-orbit torque field-like spin-orbit torque ζFL=0.21. When a current pulse with a width of 300ps flows through the bottom electrode 10, the relationship between the probability of magnetization switching of the free layer 34 and the current pulse intensity is shown in FIG. 4A, with the corresponding current thresholds being $I_{c1}$=0.62 mA, $I_{c2}$=0.77 mA, $I_{c3}$=0.97 mA and $I_{c4}$=1.19 mA respectively; when the first separation layer 33 is not present, the spin-orbit torque damping-like spin-orbit torque ζDL=−0.06 and the spin-orbit torque field-like spin-orbit torque ζFL=0.1. When a current pulse with a width of 300ps flows through the bottom electrode 10, the relationship between the probability of magnetization switching of the free layer 34 and the current pulse intensity is shown in FIG. 4B. The free layer 34 cannot realize a stable 360° and 540° magnetization switching, so the complete logic gate function cannot be realized.

Based on the characteristics of precessional magnetization switching, the functions of AND gate, NAND gate, OR gate, NOR gate, XOR gate and XNOR gate can be realized by controlling the intensity and width of the first input and second input current pulses. The complex of the first input current and the second input current is the logic input current, specifically, the current intensity of the logic input current is equal to the sum of the current intensity of the first input current and that of the second input current, or the pulse width of the logic input current is equal to the sum of the pulse width of the first input current and that of the second input current, and the logic input current is recorded as Imo, i.e. the current indicated by the arrow in FIG. 2A, wherein, the first input current is recorded as $I_{in1}$, and the second input current is recorded as $I_{in2}$.

When logical operations are performed, the logic current pulse $I_{logic}$ with a particular intensity and width flows through the bottom electrode 10 in the in-plane direction, as shown in FIG. 2A. Since the strong spin-orbit coupling of the material made of the bottom electrode 10, electrons with a specific spin direction will go through the bottom electrode 10 and accumulate at the interface between the second separation layer 35 and the free layer 34, forming a spin current perpendicular to the plane of the film. Besides, the spin-orbit torque applied by the spin current on the magnetization of the free layer 34 has a strong field-like component under the influence of the spin Hall effect and the interfacial Rashba effect. The free layer 34 undergoes a precessional magnetization switching under the above component, thus switching the magnetic tunnel junction between the high resistance state and the low resistance state.

Figure 2B:
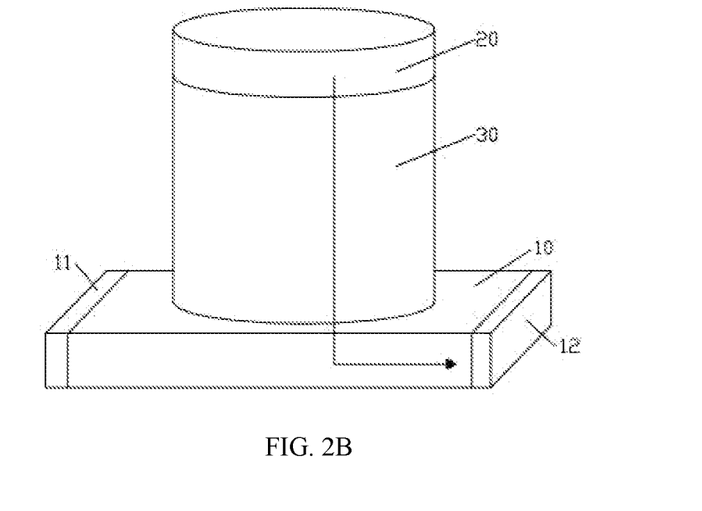
FIG. 2B is a schematic diagram of the structure of the multi-functional spintronic logic gate device when a reading current is input to the top electrode, with the arrow indicating the reading current.

When the result of a logical operation is read, the current of the reading current $I_{read}$ flows in a vertical direction through the top electrode 20, the magnetic tunnel junction 30 and the bottom electrode 10, as shown in FIG. 2B, with the arrow in the figure indicating the reading current $I_{read}$. The resistance state of the magnetic tunnel junction 30 can be read by comparing the reference voltage or reference current, thus reading the corresponding logic value.

The following description will be given through specific embodiments.

In one embodiment, let the free layer 34 and the reference layer 31 of the magnetic tunnel junction 30 be initially magnetized in the anti-parallel direction, which corresponds to the initial high resistance state and a logical value of 0. Let the pulse intensity of the logic current $I_{logic}$ flowing through the bottom electrode 10 be equal to the sum of the pulse intensity $I_{in1}$ of the first input current and that $I_{in2}$ of the second input current, where $I_{in1}$ and $I_{in2}$ can be set as high-level current $I_H$, with the corresponding logic value of 1, and low-level current $I_L$, with the corresponding logic value of 0, respectively, and there exists a relationship 0<=$I_L$<$I_H$. On the basis of the above, the method to implement the AND gate function is as follows:

The input current is controlled so that $I_L+I_H<I_{c1}$ and $I_{c1}/2<I_H<I_{c2}/2$.

In this case, when both the first input current $I_{in1}$ and the second input current $I_{in2}$ are low-level current $I_L$, the input-end current $I_{logic}$ is lower than $I_{c1}$, the magnetization direction of the free layer 34 of the magnetic tunnel junction is the same as the initial direction, the magnetic tunnel junction 30 is in the high resistance state, and the corresponding logic value is 0.

When $I_{in1}=I_L$ and $I_{in2}=I_H$, or reversely, $I_{in1}=I_H$ and $I_{in2}=I_L$, the corresponding input logic value is "0, 1" or "1, 0". At this time, the input-end current is lower than $I_{c1}$, the magnetization direction of the free layer 34 of the magnetic tunnel junction is the same as the initial direction, the magnetic tunnel junction 30 is in the high resistance state, and the corresponding output logic value is 0.

When $I_{in1}=I_H$ and $I_{in2}=I_H$, the corresponding input logic value is "1, 1". At this time, the input-end current is higher than $I_{c1}$, the magnetization direction of the free layer 34 of the magnetic tunnel junction is opposite to the initial direction, the junction is in the low resistance state, and the corresponding output logic value is 1.

As described above, the AND gate logic function can be realized, and the corresponding truth table is shown in the table below.

TABLE 1

AND gate truth table

| First input current | Second input current | Resistance state of magnetic tunnel junction (output logic value) |
|---|---|---|
| 0 | 0 | High (0) |
| 0 | 1 | High (0) |
| 1 | 0 | High (0) |
| 1 | 1 | Low (1) |

The method to implement the XOR gate function is as follows:

The input current is controlled so that $I_L<I_{c1}/2$, $I_{c2}/2<I_H<I_{c3}/2$ and $I_{c1}<I_L+I_H<I_{c2}$.

In this case, when both the first input current $I_{in1}$ and the second input current 62 are low-level current $I_L$, the input-end current $I_{logic}$ is lower than $I_{c1}$, the magnetization direction of the free layer 34 of the magnetic tunnel junction is the same as the initial direction, the junction is in the high resistance state, and the corresponding logic value is 0.

When $I_{in1}=I_L$ and $I_{in2}=I_H$, or reversely, $I_{in1}=I_H$ and $I_{in2}=I_L$, the corresponding input logic value is "0, 1" or "1, 0". At this time, the input-end current is higher than $I_{c1}$ and lower than $I_{c2}$, the magnetization direction of the free layer 34 of the magnetic tunnel junction is rotated by 180° and parallel to that of the reference layer 31, the device is in the low resistance state, and the corresponding output logic value is 1.

When $I_{in1}=I_H$ and $I_{in2}=I_H$, the corresponding input logic value is "1, 1". At this time, the input-end current is higher than $I_{c2}$ and lower than $I_{c3}$, the magnetization direction of the free layer 34 of the magnetic tunnel junction is rotated by 360° and anti-parallel to that of the reference layer 31, the device is in the high resistance state, and the corresponding output logic value is 0.

As described above, the XOR gate logic function can be realized, and the corresponding truth table is shown below.

TABLE 2

Truth table of XOR gate logic

| First input current | Second input current | Resistance state of magnetic tunnel junction (output logic value) |
|---|---|---|
| 0 | 0 | High (0) |
| 0 | 1 | Low (1) |
| 1 | 0 | Low (1) |
| 1 | 1 | High (0) |

The method to implement the OR gate function is as follows:

The input current is controlled so that $I_L<I_{c1}/2$, $I_{c3}/2<I_H<I_{c4}/2$ and $I_{c1}<I_L+I_H<I_{c2}$.

In this case, when both the first input current $I_{in1}$ and the second input current $I_{in2}$ are low-level current $I_L$, the input-end current is lower than $I_{c1}$, the magnetization direction of the free layer 34 of the magnetic tunnel junction is the same as the initial direction, the junction is in the high resistance state, and the corresponding logic value is 0.

When $I_{in1}=I_L$ and $I_{in2}=I_H$, or reversely, $I_{in1}=I_H$ and $I_{in2}=I_L$, the corresponding input logic value is "0, 1" or "1, 0". At this time, the input-end current is higher than $I_{c1}$ and lower than $I_{c2}$, the magnetization direction of the free layer 34 of the magnetic tunnel junction is rotated by 180° and parallel to that of the reference layer 31, the device is in the low resistance state, and the corresponding output logic value is 1.

When $I_{in1}=I_H$ and $I_{in2}=I_H$, the corresponding input logic value is "1, 1". At this time, the input-end current is higher than $I_{c3}$ and lower than $I_{c4}$, the magnetization direction of the free layer 34 of the magnetic tunnel junction is rotated by 540° and parallel to that of the reference layer 31, the device is in the low resistance state, and the corresponding output logic value is 1.

As described above, the OR gate logic function can be realized, and the corresponding truth table is shown in the table below.

TABLE 3

Truth table of OR gate logic

| First input current | Second input current | Resistance state of magnetic tunnel junction (output logic value) |
|---|---|---|
| 0 | 0 | High (0) |
| 0 | 1 | Low (1) |
| 1 | 0 | Low (1) |
| 1 | 1 | Low (1) |

Let the free layer 34 and the reference layer 31 of the magnetic tunnel junction being initially magnetized in the parallel direction, which corresponds to the initial low resistance state, NAND gate, XNOR gate and NOR gate based on current pulse intensity can be realized respectively with the same current pulse setting. The specific implementation method will not be described again.

The logic functions above can also be realized by controlling the width of the current pulse.

In another embodiment, let the free layer 34 and the reference layer 31 of the magnetic tunnel junction be initially magnetized in the anti-parallel direction, which corresponds to the initial high resistance state. Let the pulse width of the current flowing through the bottom electrode 10 be equal to the sum of the pulse width $t_{in1}$ of the first input current tin 1 and that $t_{in2}$ of the second input current. Where the pulse width $t_{in1}$ and $t_{in2}$ of the input current can be set to be a long pulse with a width of $t_H$, corresponding to the logic value of 1, and a short pulse with a width of $t_L$, corresponding to the logic value of 0, respectively, and there exists a relationship $0<t_L<t_H$.

On the basis of the above, the method to implement the AND gate function is as follows: The input current pulse width is controlled so that $t_L+t_H<t_{c1}$ and $t_{c1}/2<t_H<t_{c2}/2$.

In this case, when the current pulse widths of both the first input and the second input are short pulses $t_L$ the input-end current pulse width is less than $t_{c1}$, the magnetization direction of the free layer 34 of the magnetic tunnel junction is not reversed and anti-parallel to that of the reference layer 31, the junction is in the high resistance state, and the corresponding logic value is 0.

When $t_{in1}=t_L$, and $t_{in2}=t_H$, or reversely, $t_{in1}=t_H$ and $t_{in2}=t_L$, the corresponding input logic value is "0, 1" or "1, 0". At this time, the input-end current pulse width is less than $t_{c1}$, the magnetization direction of the free layer 34 of the magnetic tunnel junction is anti-parallel to that of the reference layer 31, the junction is in the high resistance state, and the corresponding output logic value is 0.

When $t_{in1}=t_H$ and $t_{in2}=t_H$, the logic value "1, 1" shall be input correspondingly. At this time, the input-end current pulse width is greater thanks, the magnetization direction of the free layer 34 of the magnetic tunnel junction is rotated by 180° and parallel to that of the reference layer 31, the junction is in the low resistance state, and the corresponding output logic value is 1.

As described above, the AND gate logic function can be realized, and the corresponding truth table is shown in Table 1.

The method to implement the XOR gate function is as follows:

The input current pulse width is controlled so that $t_L<t_{c1}/2$, $t_{c2}/2<t_H<t_{c3}/2$ and $t_{c1}<t_L+t_H<t_{c2}$.

When $t_{in1}=t_L$ and $t_{in2}=t_L$, the input-end current pulse width is less than $I_{c1}$, the magnetization direction of the free layer 34 of the magnetic tunnel junction is not reversed and anti-parallel to that of the reference layer 31, the junction is in the high resistance state, and the corresponding logic value is 0.

When $t_{in1}=t_L$, and $t_{in2}=t_H$, or reversely, $t_{in1}=t_H$ and $t_{in2}=t_L$, the corresponding input logic value is "0, 1" or "1, 0". At this time, the input-end current pulse width is greater than $t_{c1}$ and less than $t_{c2}$, the magnetization direction of the free layer 34 of the magnetic tunnel junction is rotated by 180° and parallel to that of the reference layer 31, the device is in the low resistance state, and the corresponding output logic value is 1.

When $t_{in1}=t_H$ and $t_{in2}=t_H$, the corresponding input logic value is "1, 1". At this time, the input-end current pulse width is greater than $t_{c2}$ and less than $t_{c3}$, the magnetization direction of the free layer 34 of the magnetic tunnel junction is rotated by 360° and anti-parallel to that of the reference layer 31, the device is in the high resistance state, and the corresponding output logic value is 0.

As described above, the XOR gate logic function can be realized, and the corresponding truth table is shown in Table 2.

The method to implement the OR gate function is as follows:

The input current pulse width is controlled so that $t_L<t_{c1}/2$, $t_{c3}/2<t_H<t_{c1}$ and $t_{c1}<t_L+t_H<t_{c2}$.

When $t_{in1}=t_L$ and $t_{in2}=t_L$, the input-end current is less than $t_{c1}$, the magnetization direction of the free layer 34 of the magnetic tunnel junction is not reversed and anti-parallel to that of the reference layer 31, the junction is in the high resistance state, and the corresponding logic value is 0.

When $t_{in1}=t_L$, and $t_{in2}=t_H$, or reversely, $t_{in1}=t_H$ and $t_{in2}=t_L$, the corresponding input logic value is "0, 1" or "1, 0". At this time, the input-end current pulse width is greater than $t_{c1}$ and less than $t_{c2}$, the magnetization direction of the free layer 34 of the magnetic tunnel junction is rotated by 180° and parallel to that of the reference layer 31, the device is in the low resistance state, and the corresponding output logic value is 1.

When $t_{in1}=t_H$ and $t_{in2}=t_H$, the corresponding input logic value is "1, 1". At this time, the input-end current is higher $t_{c3}$ and lower than $t_{c4}$, the magnetization direction of the free layer 34 of the magnetic tunnel junction is rotated by 540° and parallel to that of the reference layer 31, the device is in the low resistance state, and the corresponding output logic value is 1.

As described above, the OR gate function can be realized, and the corresponding truth table is shown in Table 3.

Let the free layer 34 and the reference layer 31 of the magnetic tunnel junction being initially magnetized in the parallel direction, which corresponds to the initial low resistance state, NAND gate, XNOR gate and NOR gate based on current pulse width can be realized respectively with the same current pulse setting. The specific implementation method will not be described again.

What is claimed is:

1. A multi-functional spintronic logic gate device, characterized in that, comprising:
    a magnetic tunnel junction, the magnetic tunnel junction sequentially comprising a reference layer, a tunneling insulation layer, and a free layer from a top layer to a bottom layer, a separation layer being arranged on at least one side of the two sides of the free layer, and the separation layer being made of any combination of one or more of platinum, tantalum, tungsten, titanium, rubidium, chromium, hafnium, aluminum, and corresponding metal oxides;
    a bottom electrode, adjacent to and in contact with the bottom layer of the magnetic tunnel junction and made of a heavy metal material, the periphery of the bottom electrode being coupled to first and second terminals, the first and second terminals being opposite to each other with respect to the bottom electrode and the bottom electrode being used for receiving a logic input current in a direction pointing to the second terminal along the first terminal; and
    a top electrode positioned above the reference layer.

2. The multi-functional spintronic logic gate device according to claim 1, wherein each of the two sides of the free layer has a separation layer.

3. The multi-functional spintronic logic gate device according to claim 2, wherein the free layer is a single-layer film composed of cobalt, iron, nickel, palladium, aluminum, and the alloy or boron-doped alloy of the elements above, or a composite film of multi-layer film.

4. The multi-functional spintronic logic gate device according to claim 3, wherein the signal of the logic input current is the current with constant current pulse intensity and varying current pulse width, or the current with constant current pulse width and varying current pulse intensity.

5. The multi-functional spintronic logic gate device according to claim 4, wherein when the current pulse width of the logic input current is constant and the current pulse intensity is varying, as the current pulse intensity increases, there shall be at least a first threshold current density that causes a 180° flip in the initial magnetization direction of the free layer, recorded as $I_{c1}$, a second threshold current density that causes a 360° flip in the initial magnetization direction of the free layer, recorded as $I_{c2}$, a third threshold current density that causes a 540° flip in the initial magnetization direction of the free layer, recorded as $I_{c3}$;
    When the current pulse intensity of the logic input current is constant and the current pulse width is varying, as the current pulse width increases, there shall be at least a first pulse width threshold that causes a 180° flip in the initial magnetization direction of the free layer, recorded as $t_{c1}$, a second pulse width threshold that causes a 360° flip in the initial magnetization direction of the free layer, recorded as $t_{c2}$, a third pulse width threshold that causes a 540° flip in the initial magnetization direction of the free layer, recorded as $t_{c3}$.

6. The multi-functional spintronic logic gate device according to claim 5, wherein the logic input current is the composition of the first input current and the second input current, the current intensity of the logic input current is equal to the sum of the current intensity of the first input current and that of the second input current, or the pulse width of the logic input current is equal to the sum of the pulse width of the first input current and that of the second input current; the current intensity of the first input current and the second input current has two states of high and low levels, with the high and low states recorded as $I_H$ and $I_L$, corresponding to 1 and 0 or 0 and 1, respectively; or the first input current and the second input current have two states of long and short pulse widths, with the two states of long and short pulses recorded as $t_H$ and $t_L$, corresponding to 1 and 0 or 0 and 1, respectively.

7. The multi-functional spintronic logic gate device according to claim 6, wherein setting $I_H+I_L<I_{c1}$, and $I_{c1}/2<I_H<I_{c2}/2$; or
    setting $t_L+t_H<t_{c1}$, and $t_{c1}/2<t_H<t_{c2}/2$; when the free layer and the reference layer are initially magnetized in the anti-parallel direction, the multi-functional spintronic logic gate device is configured as a logic AND gate, and when the free layer and the reference layer are initially magnetized in the parallel direction, the multi-functional spintronic logic gate device is configured as a logic NAND gate.

8. The multi-functional spintronic logic gate device according to claim 6, wherein
    setting $I_L<I_{c1}/2$, $I_{c2}/2<I_H<I_{c3}/2$ and $I_{c1}<I_L+I_H<t_{c2}$; or
    setting $t_L<t_{c1}/2$, $t_{c2}/2<t_H<t_{c3}/2$ and $t_{c1}<t_L+t_H<t_{c2}$; when the free layer and the reference layer are initially magnetized in the anti-parallel direction, the multi-functional spintronic logic gate device is configured as a logic XOR gate, and when the free layer and the reference layer are initially magnetized in the parallel direction, the multi-functional spintronic logic gate device is configured as a logic XNOR gate.

9. The multi-functional spintronic logic gate device according to claim 6, wherein
    setting $I_L<I_{c1}/2$, $I_{c3}/2<I_H<I_{c4}/2$ and $I_{c1}<I_L+I_H<t_{c2}$; or
    setting $t_L<t_{c1}/2$, $t_{c3}/2<t_H<t_{c4}/2$ and $t_{c1}<t_L+t_H<t_{c2}$; when the free layer and the reference layer are initially magnetized in the anti-parallel direction, the multi-functional spintronic logic gate device is configured as a logic OR gate, and when the free layer and the reference layer are initially magnetized in the parallel direction, the multi-functional spintronic logic gate device is configured as a logic NOR gate.

10. The multi-functional spintronic logic gate device according to claim 2, wherein the thickness range of the separation layer is 0~2 nm, the thickness range of the bottom electrode is 0.5~15 nm, and the thickness range of the free layer is 0.5~10 nm.

11. The multi-functional spintronic logic gate device according to claim 10, wherein the signal of the logic input current is the current with constant current pulse intensity and varying current pulse width, or the current with constant current pulse width and varying current pulse intensity.

12. The multi-functional spintronic logic gate device according to claim 1, wherein the free layer is a single-layer film composed of cobalt, iron, nickel, palladium, aluminum, and the alloy or boron-doped alloy of the elements above, or a composite film of multi-layer film.

13. The multi-functional spintronic logic gate device according to claim 12, wherein the signal of the logic input current is the current with constant current pulse intensity and varying current pulse width, or the current with constant current pulse width and varying current pulse intensity.

14. The multi-functional spintronic logic gate device according to claim 13, wherein when the current pulse width of the logic input current is constant and the current pulse intensity is varying, as the current pulse intensity increases, there shall be at least a first threshold current density that causes a 180° flip in the initial magnetization direction of the free layer, recorded as $I_{c1}$, a second threshold current density that causes a 360° flip in the initial magnetization direction of the free layer, recorded as $I_{c2}$, a third threshold current density that causes a 540° flip in the initial magnetization direction of the free layer, recorded as $I_{c3}$;

When the current pulse intensity of the logic input current is constant and the current pulse width is varying, as the current pulse width increases, there shall be at least a first pulse width threshold that causes a 180° flip in the initial magnetization direction of the free layer, recorded as $t_{c1}$, a second pulse width threshold that causes a 360° flip in the initial magnetization direction of the free layer, recorded as $t_{c2}$, a third pulse width threshold that causes a 540° flip in the initial magnetization direction of the free layer, recorded as $t_{c3}$.

15. The multi-functional spintronic logic gate device according to claim 14, wherein the logic input current is the composition of the first input current and the second input current, the current intensity of the logic input current is equal to the sum of the current intensity of the first input current and that of the second input current, or the pulse width of the logic input current is equal to the sum of the pulse width of the first input current and that of the second input current; the current intensity of the first input current and the second input current has two states of high and low levels, with the high and low states recorded as $I_H$ and $I_L$, corresponding to 1 and 0 or 0 and 1, respectively; or the first input current and the second input current have two states of long and short pulse widths, with the two states of long and short pulses recorded as $t_H$ and $t_L$, corresponding to 1 and 0 or 0 and 1, respectively.

16. The multi-functional spintronic logic gate device according to claim 15, wherein setting $I_H+I_L<I_{c1}$, and $I_{c1}/2<I_H<I_{c2}/2$; or setting $t_L+t_H<t_{c1}$, and $t_{c1}/2<t_H<t_{c2}/2$; when the free layer and the reference layer are initially magnetized in the anti-parallel direction, the multi-functional spintronic logic gate device is configured as a logic AND gate, and when the free layer and the reference layer are initially magnetized in the parallel direction, the multi-functional spintronic logic gate device is configured as a logic NAND gate.

17. The multi-functional spintronic logic gate device according to claim 15, wherein setting $I_L<I_{c1}/2$, $I_{c2}/2<I_H<I_{c3}/2$ and $I_{c1}<I_L+I_H<I_{c2}$; or setting $t_L<t_{c1}/2$, $t_{c2}/2<t_H<t_{c3}/2$ and $t_{c1}<t_L+t_H<t_{c2}$; when the free layer and the reference layer are initially magnetized in the anti-parallel direction, the multi-functional spintronic logic gate device is configured as a logic XOR gate, and when the free layer and the reference layer are initially magnetized in the parallel direction, the multi-functional spintronic logic gate device is configured as a logic XNOR gate.

18. The multi-functional spintronic logic gate device according to claim 15, wherein setting $I_L<I_{c1}/2$, $I_{c3}/2<I_H<I_{c4}/2$ and $I_{c1}<I_L+I_H<I_{c2}$; or setting $t_L<t_{c1}/2$, $t_{c3}/2<t_H<t_{c4}/2$ and $t_{c1}<t_L+t_H<t_{c2}$; when the free layer and the reference layer are initially magnetized in the anti-parallel direction, the multi-functional spintronic logic gate device is configured as a logic OR gate, and when the free layer and the reference layer are initially magnetized in the parallel direction, the multi-functional spintronic logic gate device is configured as a logic NOR gate.

19. The multi-functional spintronic logic gate device according to claim 1, wherein the thickness range of the separation layer is 0~2 nm, the thickness range of the bottom electrode is 0.5~15 nm, and the thickness range of the free layer is 0.5~10 nm.

20. The multi-functional spintronic logic gate device according to claim 19, wherein the signal of the logic input current is the current with constant current pulse intensity and varying current pulse width, or the current with constant current pulse width and varying current pulse intensity.

* * * * *